US009122148B2

(12) United States Patent
Miller et al.

(10) Patent No.: US 9,122,148 B2
(45) Date of Patent: Sep. 1, 2015

(54) MASTER TEMPLATE REPLICATION

(75) Inventors: Michael N. Miller, Austin, TX (US);
Cynthia B. Brooks, Austin, TX (US);
Laura Anne Brown, Austin, TX (US);
Gerard M. Schmid, Austin, TX (US)

(73) Assignees: Canon Nanotechnologies, Inc., Austin, TX (US); Molecular Imprints, Inc., Austin, TX (US)

( * ) Notice: Subject to any disclaimer, the term of this patent is extended or adjusted under 35 U.S.C. 154(b) by 911 days.

(21) Appl. No.: 12/607,564

(22) Filed: Oct. 28, 2009

(65) Prior Publication Data

US 2010/0109194 A1 May 6, 2010

Related U.S. Application Data

(60) Provisional application No. 61/111,139, filed on Nov. 4, 2008, provisional application No. 61/110,633, filed on Nov. 3, 2008.

(51) Int. Cl.
*G03F 7/00* (2006.01)
*B82Y 10/00* (2011.01)
*B82Y 40/00* (2011.01)
*G11B 5/855* (2006.01)

(52) U.S. Cl.
CPC .............. *G03F 7/0002* (2013.01); *B82Y 10/00* (2013.01); *B82Y 40/00* (2013.01); *G11B 5/855* (2013.01)

(58) Field of Classification Search
CPC ..................................... G03F 7/0002
USPC ....................................... 264/293
See application file for complete search history.

(56) References Cited

U.S. PATENT DOCUMENTS

| | | |
|---|---|---|
| 5,772,905 A | 6/1998 | Chou |
| 6,696,220 B2 | 2/2004 | Bailey et al. |
| 6,900,881 B2 | 5/2005 | Sreenivasan et al. |
| 6,916,584 B2 | 7/2005 | Sreenivasan et al. |
| 6,919,152 B2 | 7/2005 | Sreenivasan et al. |
| 6,986,975 B2 | 1/2006 | Sreenivasan et al. |
| 7,027,156 B2 | 4/2006 | Watts et al. |
| 7,037,639 B2 | 5/2006 | Voisin |
| 7,070,405 B2 | 7/2006 | Sreenivasan et al. |
| 7,077,992 B2 | 7/2006 | Sreenivasan et al. |
| 7,136,150 B2 | 11/2006 | Sreenivasan et al. |
| 7,229,273 B2 | 6/2007 | Bailey et al. |
| 7,281,921 B2 | 10/2007 | Watts et al. |
| 7,309,225 B2 | 12/2007 | McMackin et al. |
| 2004/0065976 A1 | 4/2004 | Sreenivasan et al. |
| 2004/0163563 A1 | 8/2004 | Sreenivasan et al. |
| 2005/0064344 A1 | 3/2005 | Bailey et al. |
| 2005/0084804 A1 | 4/2005 | Truskett et al. |
| 2005/0189676 A1 | 9/2005 | Sreenivasan |
| 2005/0230882 A1 | 10/2005 | Watts et al. |
| 2006/0019183 A1 | 1/2006 | Voisin |

(Continued)

FOREIGN PATENT DOCUMENTS

| | | |
|---|---|---|
| EP | 1542074 | 6/2005 |
| WO | 2001-059523 | 8/2001 |
| WO | 2006/131153 | 12/2006 |

*Primary Examiner* — Larry Thrower
(74) *Attorney, Agent, or Firm* — Cameron A. King

(57) ABSTRACT

Systems and methods for providing multiple replicas from a master template are described. Replicas may be formed having a mesa. In one embodiment, a dummy fill region may be included on master template and/or replicas.

10 Claims, 7 Drawing Sheets

(56) References Cited

U.S. PATENT DOCUMENTS

| | | |
|---|---|---|
| 2006/0113697 A1 | 6/2006 | Sreenivasan |
| 2006/0272535 A1 | 12/2006 | Seki et al. |
| 2007/0122942 A1 | 5/2007 | Sreenivasan et al. |
| 2008/0090170 A1 | 4/2008 | Yoneda |
| 2008/0095878 A1 | 4/2008 | Bailey et al. |
| 2009/0130598 A1 | 5/2009 | Schmid et al. |
| 2009/0166933 A1 | 7/2009 | Sreenivasan |
| 2009/0212012 A1 | 8/2009 | Brooks et al. |

MASTER TEMPLATE REPLICATION

CROSS-REFERENCE TO RELATED APPLICATIONS

This application claims the benefit under 35 U.S.C. §119(e)(1) of U.S. Provisional Patent Application No. 61/110,633 filed Nov. 3, 2008, and U.S. Provisional Patent Application No. 61/111,139 filed Nov. 4, 2008; both of which are hereby incorporated by reference herein in their entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a formable layer (polymerizable) and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
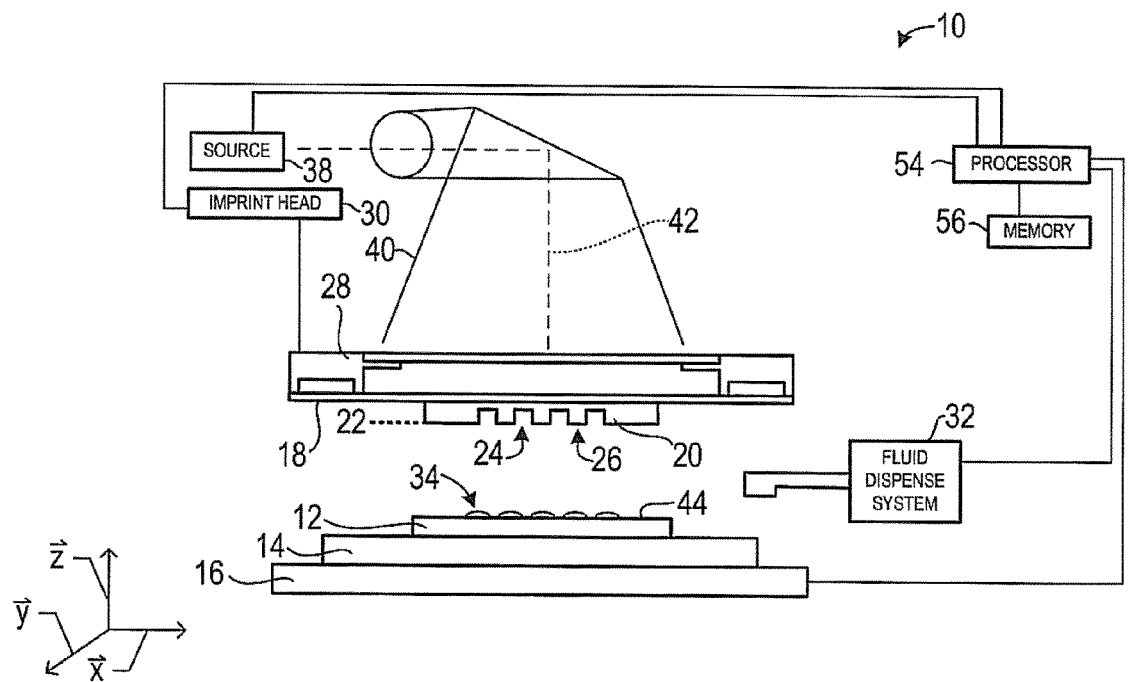
FIG. 1 illustrates a simplified side view of a lithographic system in accordance with an embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion along the x-, y-, and z-axes. Stage 16, substrate 12, and substrate chuck 14 may also be positioned on a base (not shown).

Spaced-apart from substrate 12 is a template 18. Template 18 may include a mesa 20 extending therefrom towards substrate 12, mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer mixture as described in U.S. Pat. No. 7,157,036 and U.S. Patent Publication No. 2005/0187339, all of which are hereby incorporated by reference.

Figure 2:
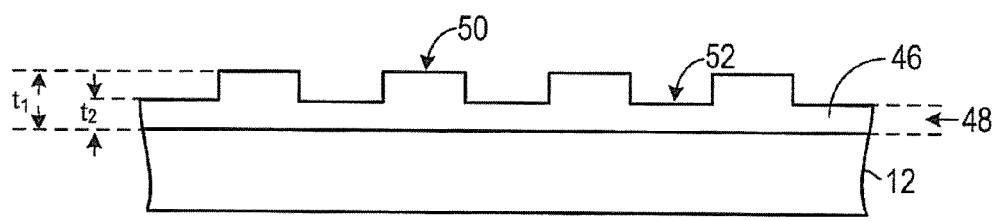
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage 16 may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Figure 3:
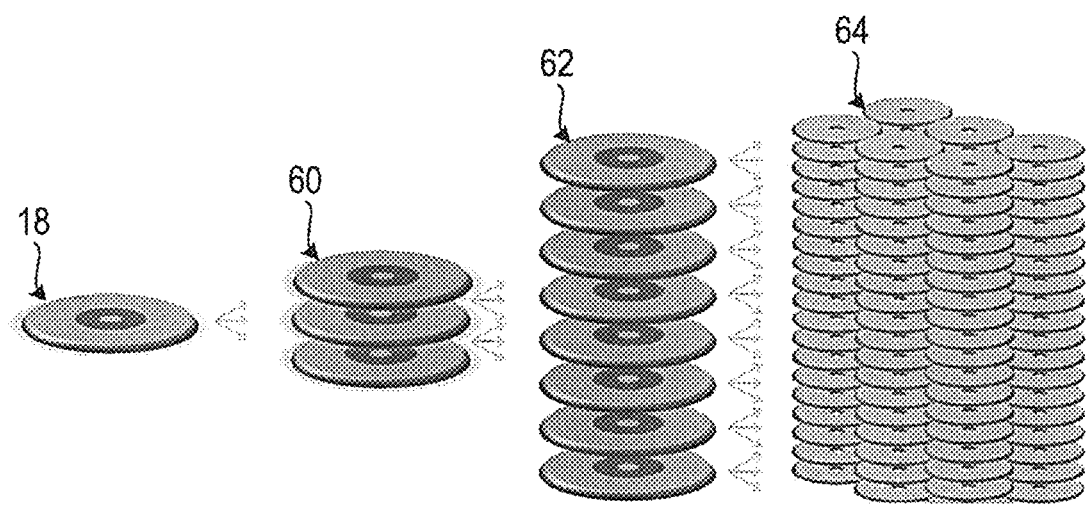
FIG. 3 illustrates a flow diagram of an exemplary method for template replication.

As template 18 may be expensive to manufacture, replications of a template 18 may aid in reducing manufacturing costs. FIG. 3 illustrates a flow diagram for supplying such replications for the production of hard disk drive substrates 64. Generally, template 18, hereinafter referred to as master template 18, may be replicated to form a first replica 60 (i.e., sub-master template). For example, master template 18 may form approximately 10 sub-master templates. First replica(s) 60 may then form a second replica 62 (i.e., working template). For example, 10 sub-master templates may form approximately 10,000 working templates. Second replica(s) 62 are generally templates used to pattern a multitude of hard disk drive substrates 64. For example, the plurality of second replicas 62 illustrated in FIG. 3 may be used to form approximately 100,000,000 hard disk drive substrates 64, and even further employing up to 200,000,000 lithography steps for double-sided patterned substrates.

Figure 4A:
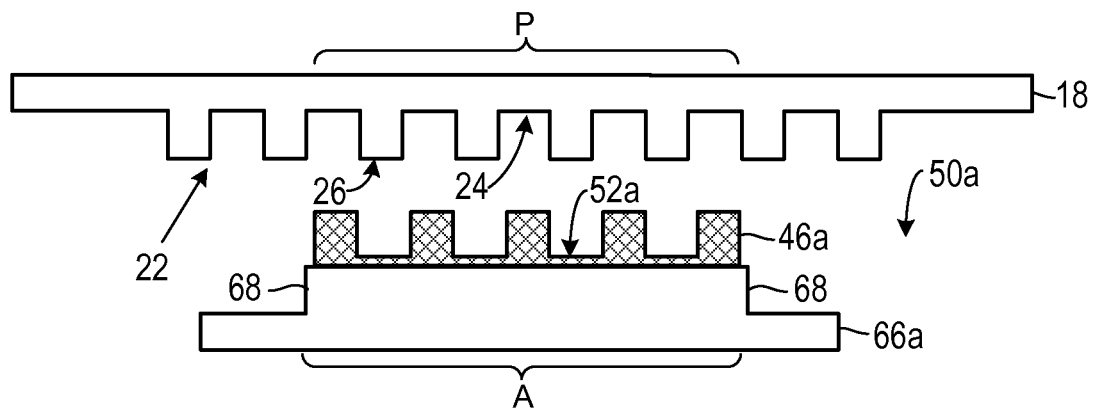
FIGS. 4A-4C illustrate simplified side views of exemplary formation of a first replica from a master template.
Figure 4B:
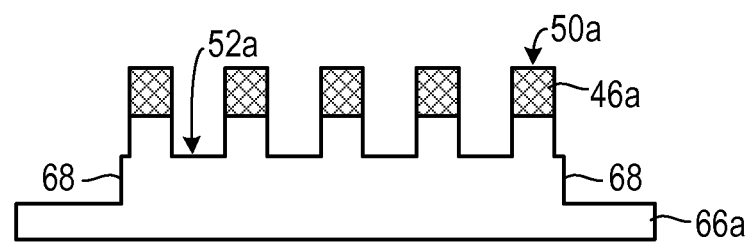
Figure 4C:
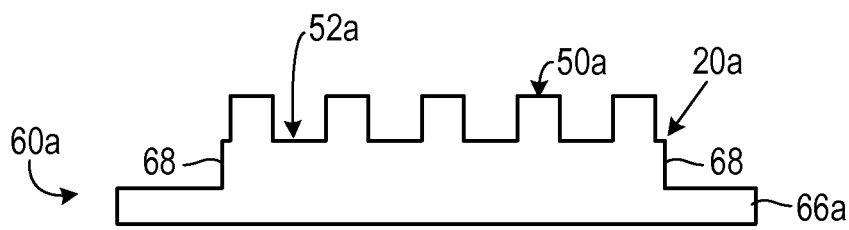

FIGS. 4A-4C illustrate simplified side views of an exemplary method for formation of a first replica 60a. First replica 60a may be formed from substrate layer 66a. In particular, a pattern may be imprinted in material deposited on surface of substrate layer 66a. The pattern may be provided by patterning surface 22 of template 18. Template 18 may or may not include mesa 20.

Referring to FIG. 4A, substrate layer 66a may be formed of materials including, but not limited to, fused-silica, quartz, silicon, organic polymers, siloxane polymers, borosilicate glass, fluorocarbon polymers, metal, hardened sapphire, and/or the like. It should be noted that substrate layer 66a may comprise additional layers of materials (e.g., hard metal layer, oxide layer, and/or the like).

Substrate layer 66a may include a raised edge 68a. Raised edge 68a may provide for only a portion P of patterning surface 22 of template 18 to imprint on substrate layer 66a. For example, in FIG. 4, portion P of patterning surface of template 18 imprints only within an area A of substrate layer 66a. Area A may be defined by boundaries of raised edge 68.

By adjusting boundaries of raised edge 68 of substrate layer 66a, the pattern imprinted by template 18 may be also adjusted. For example, pattern provided by patterning surface 22 may be translated along an x-axis altering the resulting pattern provided in first replica 60a.

Polymerizable material 34 may placed between master template 18 and substrate layer 66a and patterned to provide patterned layer 46a as described using systems and methods of FIGS. 1 and 2.

Referring to FIG. 4B, patterned layer 46a may be transferred into substrate layer 66a. For example, patterned layer 46a may be etched using techniques including, but not limited to, reactive ion etching (e.g., oxygen descum, CI dry etch), and other techniques as described in U.S. Pat. No. 7,259,102, U.S. Ser. No. 11/240,707, U.S. Pat. No. 7,252,777, U.S. Pat. No. 7,041,604, U.S. Pat. No. 7,256,131, U.S. Pat. No. 7,261,831, U.S. Pat. No. 7,323,417, U.S. Ser. No. 11/844,824, U.S. Ser. No. 12/182,905, and U.S. Pat. No. 7,179,396, all of which are hereby incorporated by reference in their entirety.

Referring to FIG. 4C, after transferring pattern into substrate layer 66a, patterned layer 46a may be removed forming first replica 60a. Raised edge 68 aids in forming mesa 20a of first replica 60a. Mesa 20a may substantially prevent first replica 60a from contacting pre-determined regions of subsequent replicas during imprinting. For example, mesa 20a may substantially prevent first replica 60a from contacting regions of subsequent replicas having particles.

Figure 5A:
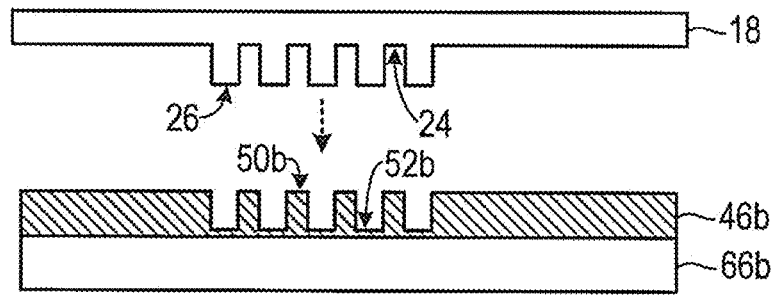
FIGS. 5A-5C illustrate simplified side views of another exemplary formation of a first replica from a master template.
Figure 5B:
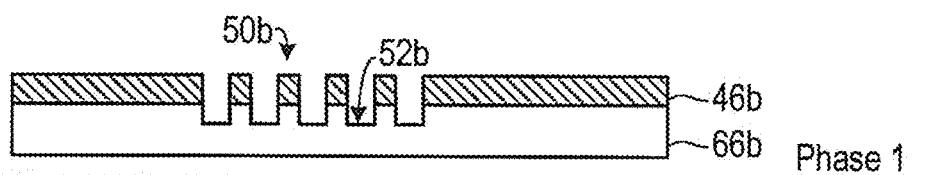
Figure 5C:
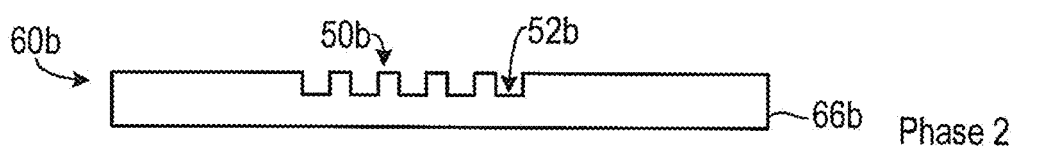
Figure 6A:
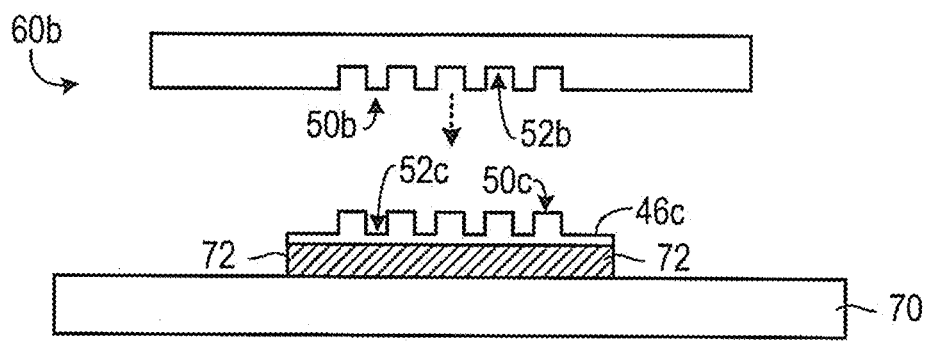
FIGS. 6A-6C illustrate simplified side views of exemplary formation of a second replica from a first replica.
Figure 6B:
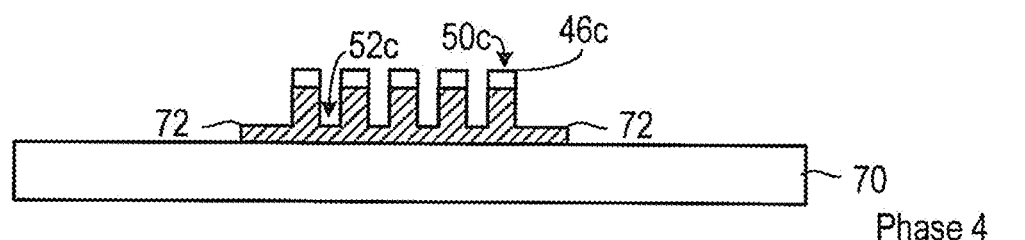
Figure 6C:
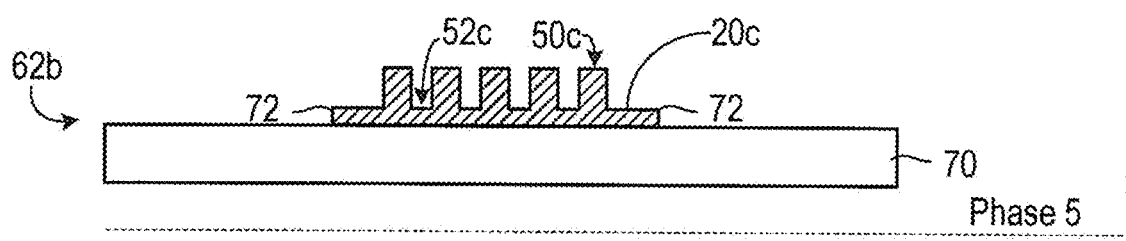

FIGS. 5A-5C illustrate simplified side views of another exemplary method for formation of a first replica 60b. Additionally, FIGS. 6A-6C illustrate simplified side views of an exemplary method for formation of a second replica 62b using first replica 60b. As shown, pattern provided by template 18 may be similar to resulting pattern of second replica 62b while pattern of first replica 60b may be an inverse (i.e., mirror image) of the pattern provided by template 18 and second replica 62b.

During transfer of pattern between template 18 to first replica 60b, features 24 and 26 of template 18 may define features 50b and 52b of first replica 60b. In a similar fashion, during transfer of pattern between first replica 60b and second replica 62b, features 50b and 52b of first replica 60b may define features 50c and 52c of second replica 62c. During each pattern transfer (e.g., master template 18 to first replica 60b), the shape, size, and depth of the features may be altered resulting in different shapes, sizes, and/or depths other than those provided by features 24 and 26.

Referring to FIG. 5A, first replica 60b may be formed from substrate layer 66b. Substrate layer 68b may be formed of materials including, but not limited to, fused-silica, quartz, silicon, organic polymers, siloxane polymers, borosilicate glass, fluorocarbon polymers, metal, hardened sapphire, and/or the like. It should be noted that substrate layer 66b may comprise additional layers of materials (e.g., hard metal layer, oxide layer, and/or the like).

Polymerizable material 34 may placed between master template 18 and substrate layer 66b and patterned forming patterned layer 46b using system and methods as described in relation to FIGS. 1 and 2.

Referring to FIG. 5B, features 50b and 52b of patterned layer 46b may be transferred into substrate layer 68b. For example, features 50b and 52b may be transferred using techniques including, but not limited to, reactive ion etching (e.g., oxygen descum, CI dry etch), and other techniques as described in U.S. Pat. No. 7,259,102, U.S. Ser. No. 11/240,707, U.S. Pat. No. 7,252,777, U.S. Pat. No. 7,041,604, U.S. Pat. No. 7,256,131, U.S. Pat. No. 7,261,831, U.S. Pat. No. 7,323,417, U.S. Ser. No. 11/844,824, U.S. Ser. No. 12/182,905, and U.S. Pat. No. 7,179,396, all of which are hereby incorporated by reference in their entirety.

Referring to FIG. 5C, patterned layer 46b may be removed forming first replica 60b. First replica 60b may be devoid of a mesa. Additionally, first replica 60b may include a mirror image pattern of features 24 and 26 of template 18.

Referring to FIGS. 6A-6C, pattern of features 50b and 52b of first replica 60b may be used to form features 50c and 52c of second replica 62b.

Second replica 62b may be formed from substrate layer 70. Substrate layer 70 may be formed of materials including, but not limited to, fused-silica, quartz, silicon, organic polymers, siloxane polymers, borosilicate glass, fluorocarbon polymers, metal, hardened sapphire, and/or the like. It should be noted that sub-master blank 66c may comprise additional layers of materials (e.g., hard metal layer, oxide layer, and/or the like). Substrate layer 70 may include raised edges 72 similar to raised edges 68 of FIGS. 4A-4C. Alternatively, substrate layer 70 may be substantially planar.

First replica 60b may imprint patterned layer 46c on substrate layer 70 using systems and methods as described in relation to FIGS. 1 and 2. Referring to FIG. 6B, features 50c and 52c of patterned layer 46c may be further transferred into substrate layer 70. For example, features 50c and 52c may be further transferred by techniques including, but not limited to etching (e.g., reactive ion etching such as oxygen descum, CI dry etch, and the like) and other techniques as described in U.S. Pat. No. 7,259,102, U.S. Ser. No. 11/240,707, U.S. Pat. No. 7,252,777, U.S. Pat. No. 7,041,604, U.S. Pat. No. 7,256,131, U.S. Pat. No. 7,261,831, U.S. Pat. No. 7,323,417, U.S. Ser. No. 11/844,824, U.S. Ser. No. 12/182,905, and U.S. Pat. No. 7,179,396, all of which are hereby incorporated by reference in their entirety Referring to FIG. 6C, patterned layer 46c may be removed to form second replica 62b. Second replica 62b may include mesa 20c. Mesa 20c may substantially prevent second replica 62b from contacting pre-determined regions of second replica 62b during imprinting. For example, mesa 20c may substantially prevent second replica 62b from contacting regions of hard disk drive substrates 64 having particles. Master template 18 may or may not include mesa 20 depending on design considerations. Alternatively, second replica 62b may be devoid of mesa 20c.

Figure 7:
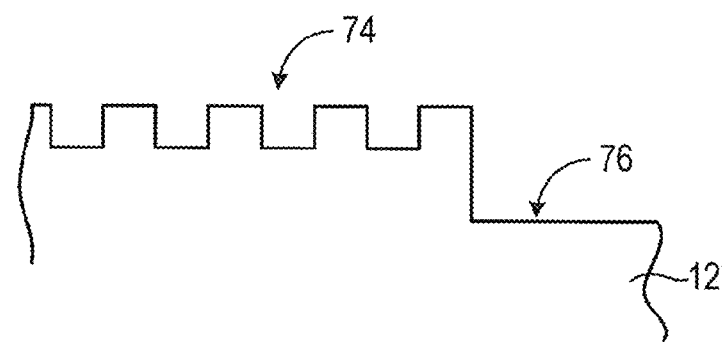
FIG. 7 illustrates a simplified side view of a substrate having a functional area and a non-functional area.

Critical dimensions of features located at inner and outer edges of a transferred pattern (e.g., transferred from template 18 to first replica 60) may be different than critical dimensions of features located at a center of the transferred pattern. This may be caused by relative loading, non-uniform transfer, and the like. For example, as illustrated in FIG. 7, subsequent to patterning of a region on substrate 12, surface of substrate 12 may have a functional area 74 and a non-functional area 76. An abrupt transition from functional area 74 (having features) to non-functional area 76 (having no features) may result in non-uniform etching of substrate 12 during the patterning process.

Figure 8:
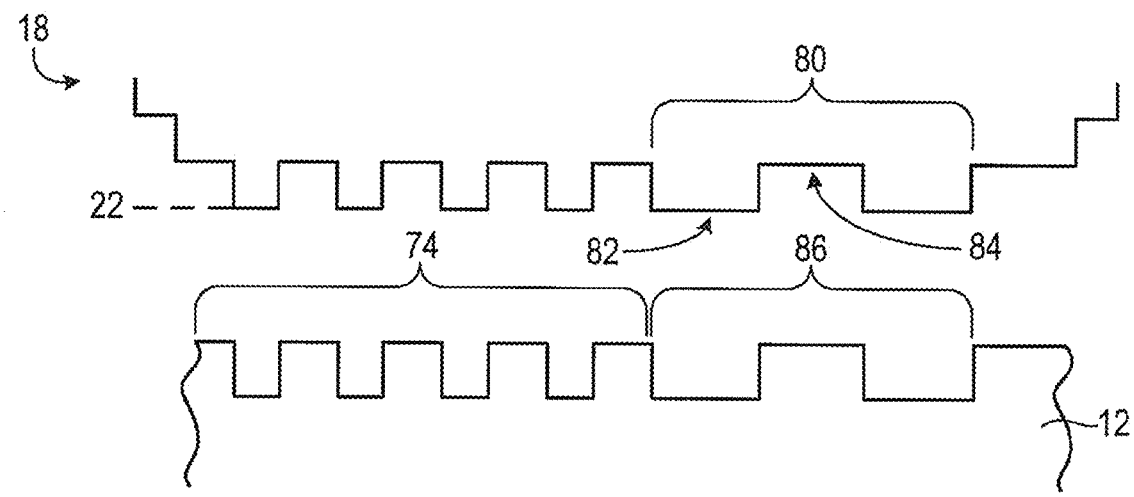
FIG. 8 illustrate a simplified side view of a template having a dummy fill region and a corresponding non-functional feature area on a substrate.
Figure 9:
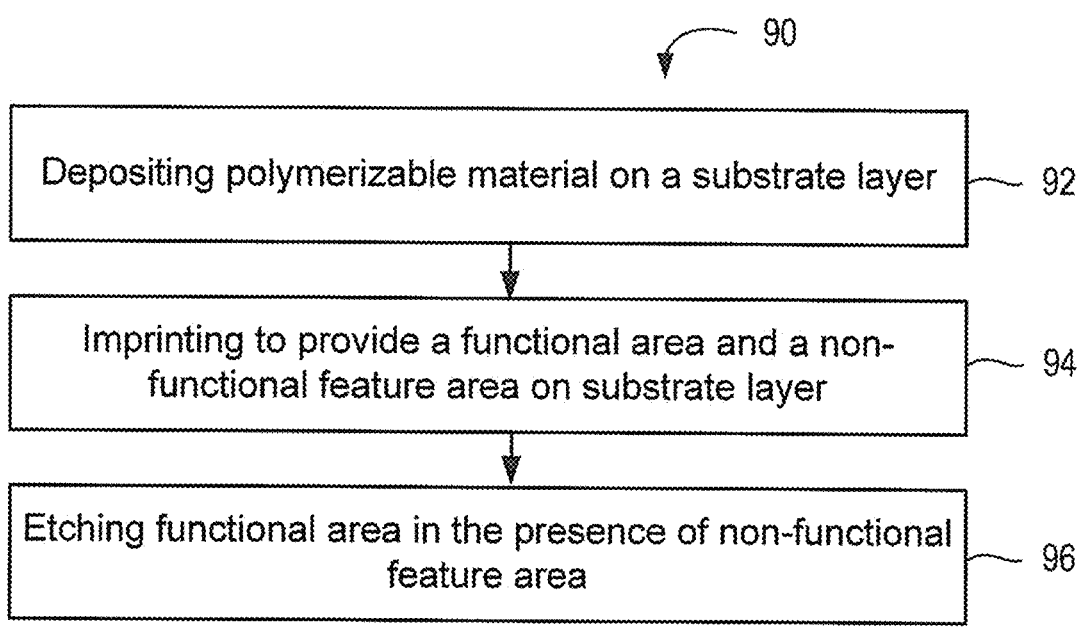
FIG. 9 illustrates a flow chart of an exemplary method of patterning using an imprint lithography template having a dummy fill region.

Referring to FIGS. 8-9, template 18 and/or replicas 60 and 62 may include one or more dummy fill regions 80 to maintain critical dimension of features during transfer. Dummy fill region 80 may include protrusions 82 and recession 84. Protrusions 82 and/or recessions 84 may be low-resolution elements providing a non-functional feature area 86.

Dummy fill regions 80 may be useful during whole-wafer replication; however, dummy fill regions 80 may be used in other imprint lithography process applications within other industries including semiconductor industry, biomedical industry, solar cell industry, and the like.

FIG. 9 illustrates a flow diagram 90 for patterning using template 18 having dummy fill region 80. In a step 92, polymerizable material 34 may be deposited on substrate layer 66. In a step 94, template 18 may imprint polymerizable material 34 to provide functional area 74 using features 22 and 24 and non-functional feature area 86 using features 82 and 84 of dummy fill region 80. In a step 96, functional area 74 may be etched in the presence of non-functional feature area 86.

What is claimed is:

1. A method, comprising:
    patterning a first substrate using an imprint lithography template, the imprint lithography template having a first feature pattern having a first plurality of protrusions and recessions;
    in response to patterning the first substrate, forming, in the first substrate, a first replica having a second feature pattern having a second plurality of protrusions and recessions, the second feature pattern being a mirror image of the first feature pattern;
    patterning a second substrate using the first replica; and
    in response to patterning the second substrate, forming, in the second substrate, a second replica having i) a body, ii) raised edges extending from only a portion of the body defining a mesa therebetween and iii) a third feature pattern formed on the mesa and having a third plurality of protrusions and recessions, wherein the first feature pattern and the third feature pattern are substantially similar.

2. The method of claim 1, wherein the first replica is devoid of a mesa.

3. The method of claim 1, wherein the imprint lithography template includes the first feature pattern and a dummy fill region, wherein the first feature pattern is adapted to provide a functional pattern region and the dummy fill region is adapted to provide a non-functional pattern region.

4. The method of claim 1, wherein the first replica includes the second feature pattern and a dummy fill region, wherein the second feature pattern is adapted to provide a functional pattern region and the dummy fill region is adapted to provide a non-functional pattern region.

5. The method of claim 1, wherein the second replica includes the third feature pattern and a dummy fill region, wherein the third feature pattern is adapted to provide a functional pattern region and the dummy fill region is adapted to provide a non-functional pattern region.

6. The method of claim 1, wherein the raised edges provide patterning of only a portion of the second feature pattern from the first replica to the second replica.

7. The method of claim 6, wherein the third feature pattern is a translated version of the first feature pattern.

8. The method of claim 1, wherein patterning the first replica includes:
    depositing polymerizable material between the imprint lithography template and the first substrate;
    conforming the polymerizable material between the imprint lithography template and the first substrate;
    solidifying the polymerizable material forming a patterned layer having the second feature pattern; and,
    transferring the second feature pattern into the first substrate.

9. The method of claim 1, wherein patterning the second replica includes:
    depositing polymerizable material between the imprint lithography template and the second substrate;
    conforming the polymerizable material between the first replica and the second substrate;
    solidifying the polymerizable material forming a patterned layer having the third feature pattern; and,
    transferring the third feature pattern into the second substrate.

10. The method of claim 1, wherein the third feature pattern is a mirror image of the second feature pattern.

* * * * *